(12) United States Patent
Haas et al.

(10) Patent No.: US 6,809,751 B2
(45) Date of Patent: Oct. 26, 2004

(54) CARD PRINTING SYSTEM AND METHOD (75) Inventors: Darren W. Haas, Bloomington, MN (US); I. Tony Haugen, Minnetonka, MN (US); Bradley A. Paulson, Northfield, MN (US); Robert J. Innes, Savage, MN (US)

(73) Assignee: CyCard Technologies, Inc., Bloomington, MN (US)

( * ) Notice: Subject to any disclaimer, the term of this patent is extended or adjusted under 35 U.S.C. 154(b) by 0 days.

(21) Appl. No.: 10/677,762

(22) Filed: Oct. 2, 2003

(65) Prior Publication Data
US 2004/0125201 A1 Jul. 1, 2004

Related U.S. Application Data (60) Provisional application No. 60/415,654, filed on Oct. 2, 2002.

(51) Int. Cl.[7] ................................................ B41J 2/435
(52) U.S. Cl. ...................................................... 347/228
(58) Field of Search ................................ 347/224, 262, 347/264, 228

(56) References Cited

U.S. PATENT DOCUMENTS 6,229,558 B1     5/2001   Saigo et al.

2003/0124451 A1 * 7/2003 Camillus et al. ............. 430/138

FOREIGN PATENT DOCUMENTS

| JP | 10-198043 | * | 7/1998 | ............... B41J/2/44 |
| JP | 2000-71517 | * | 3/2000 | ............... B41J/2/44 |
| JP | 2001-212998 | * | 8/2001 | ............. B41J/2/435 |
| WO | WO 03/040825 | * | 5/2003 | ............. G03F/7/00 |

* cited by examiner

Primary Examiner—Huan Tran
(74) Attorney, Agent, or Firm—Petterson, Thuente, Skaar & Christensen, P.A.

(57) ABSTRACT

The card printing system of the present invention includes a cartridge sub-assembly and a printer sub-assembly. The cartridge sub-assembly encloses a stack of horizontally positioned cards that have each been plied with photosensitive microcapsules. The printer sub-assembly interfaced with the cartridge sub-assembly to obtain a card from the stack. The printer sub-assembly then forms a latent image upon the photosensitive microcapsules upon the obtained card and develops that image by applying a mechanical pressure to the photosensitive microcapsules with a developer array. The develop array is a block containing a number spring-loaded developer balls.

27 Claims, 10 Drawing Sheets

CARD PRINTING SYSTEM AND METHOD

CLAIM TO PRIORITY

The present invention claims priority to U.S. Provisional Patent Application No. 60/415,654, filed Oct. 2, 2002, and entitled "Printer, Printing System, and Printing Method Using Identification Card with Photosensitive Microcapsules Applies Thereto." The identified provisional application is hereby incorporated by reference in its entirety.

FIELD OF THE INVENTION

The present application relates to printing systems and, more particularly, to printing systems for printing cards that incorporate photosensitive microcapsules.

BACKGROUND OF THE INVENTION

A common method of fabricating printed identification cards uses dye diffusion thermal transfer, or D2T2, to transfer colored dyes from a print ribbon to the blank identification card. In this process, a ribbon carrying dye in a polymeric binder is heated from behind with a thermal print head (TPH), while in contact with a vinyl, or PVC, surface. As each pixel heats the ribbon, the dye melts and diffuses from the ribbon, into the vinyl surface. Printing with successive yellow, magenta, and cyan panels across the substrate, creates a three-color image in the surface. Since the amount of transferred dye is directly proportional to the amount of heat from the corresponding pixel, true color representation is possible in the printed image. However, when using D2T2 methods to print to hard, plastic identification cards, the apparent quality of the printed image frequently depends on the ability of the mechanical printer systems to accurately register each of the printing sequences, yellow, magenta, cyan, and black, and to smoothly move the substrate and ribbon beneath the TPH during the print sequences. Furthermore, since the efficiency of transferring the dye from the heated pixel to the surface of the card depends on close, intimate contact, the presence of dirt, debris, or surface imperfections will preclude contact of the ribbon with the surface, leaving corresponding voids and vacancies in the printed image.

Frequently, the D2T2 print ribbon also contains a resin panel to print black resin for barcode applications and a clear protective overlaminate panel for application over the printed image. Mass transfer of both the resin and the overlaminate panels is accomplished as the TPH heats the ribbon and the material is released from the ribbon, and adheres to the surface of the card. Again, the apparent quality of the printed resin image, and the coherence of the overlaminate panel depends on the ability of the mechanical printer system to accurately register each of the ribbon panels, and smoothly move the card, and the ribbon beneath the TPH during the print sequences. However, while imperfections in surface smoothness interfere with dye transfer, it is surface contamination, such as oils, that interfere with the adhesion of the resin and overlaminate to the surface of the card.

Recent innovations to reduce the effect of the card surface in identification card printing include D2T2 printing to an Intermediate Transfer Media, InTM, which is transferred to the card surface and ink jet printing to a receptive card surface. While these techniques can reduce the dependence of the perceived quality of the printed data on the quality of the surface characteristics of the card, transferring the colorant from a reservoir to the surface remains the printing mechanism. As such, printing speed is fundamentally inversely related to the quality of the printed data; i.e., the more photo realistic images are achieved by slowing down the print speed and, conversely, printing identification cards quickly generally provides very non-photo realistic images.

Thus, an improved method of generating photo realistic identification cards quickly presumes that the colorants, or colorant precursors, are already present in the card. Saigo, et al., U.S. Pat. No. 6,229,558 teaches such a printer and printing method. The printer includes a carriage for scanning red, green, and blue light over print paper containing photosensitive microcapsules encapsulating a color developing material and a photo curing material and having an image receiving layer for developing color by a reaction of the color developing material with the image receiving layer. However, the light is applied with a scanning mechanism, fundamentally repeating the inverse relationship of ink-jet printing—print speed is increased by reducing the resolution of the printing and resolution of the printed image is increased by reducing the scanning speed. Also, since the mechanical pressure is applied to the media—a process called developing—by a scanning ball mechanism, the same inverse relations exists, where a higher resolution of the development results in a longer development time.

SUMMARY OF THE INVENTION

The present invention addresses the limitations of the above-described prior art. The card printing system of the present invention includes a cartridge sub-assembly and a printer sub-assembly. The cartridge sub-assembly encloses a stack of horizontally positioned cards that have each been plied with photosensitive microcapsules. The printer sub-assembly interfaced with the cartridge sub-assembly to obtain a card from the stack. The printer sub-assembly then forms a latent image upon the photosensitive microcapsules upon the obtained card and develops that image by applying a mechanical pressure to the photosensitive microcapsules with a developer array. The develop array is a block containing a number spring-loaded developer balls.

A method of the present invention includes the following steps: (1) supplying an identification card that has been previously plied with photosensitive microcapsules; (2) forming a latent image upon said identification card; and (3) developing the latent image by application of an array of pressure points to the latent image.

DETAILED DESCRIPTION OF THE PREFERRED EMBODIMENTS

The printing system of the present invention includes a printer in which a latent image is formed by transmitting light through a fixture to provide red, green, and blue light over a media identification card onto which photosensitive microcapsules are applied, and by applying a mechanical pressure through an array of balls to the identification card with the latent image formed thereon.

Figure 1:
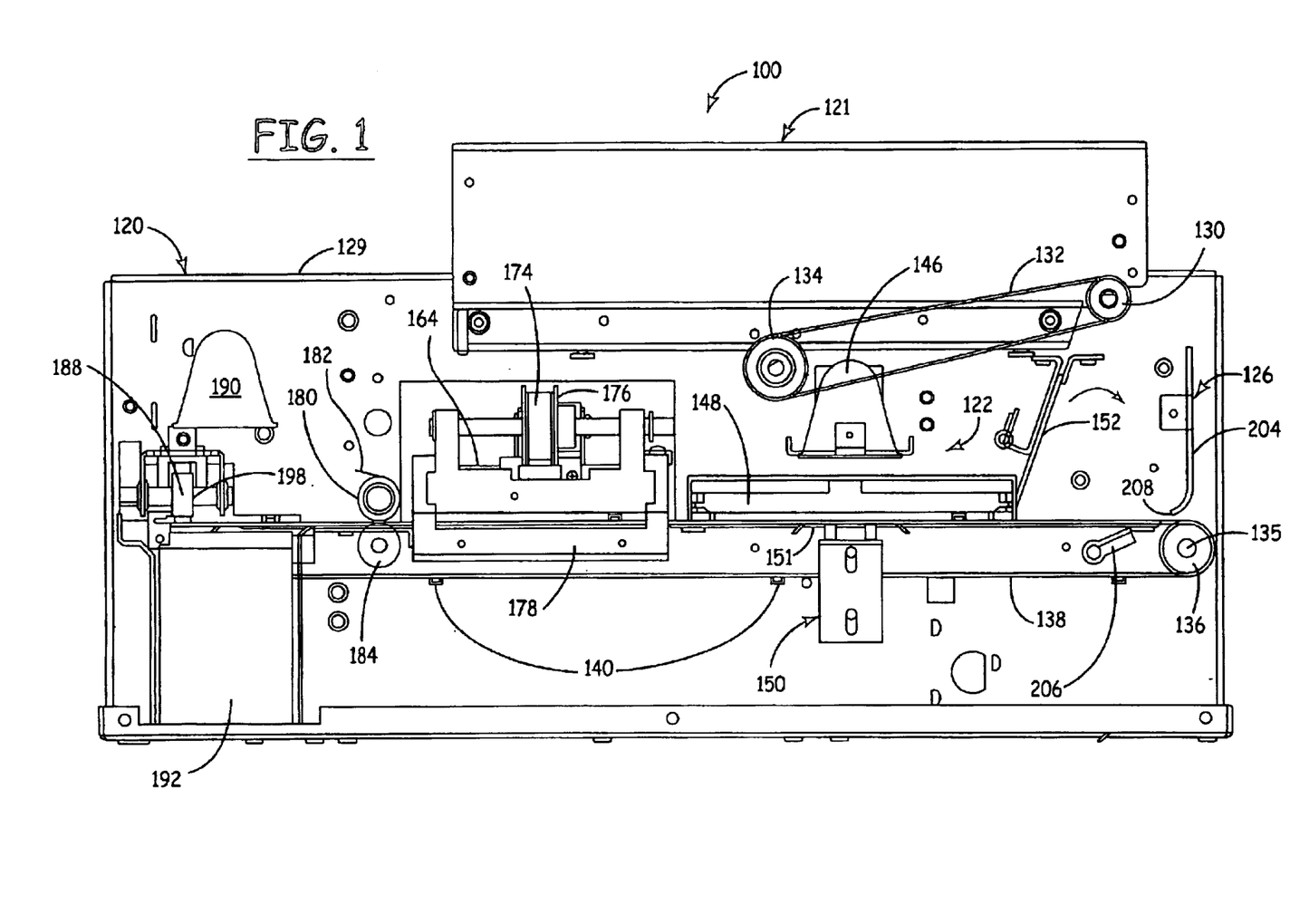
FIG. 1 is a cross-section viewed from the front of the printer according to a preferred embodiment of the present invention.
Figure 2:
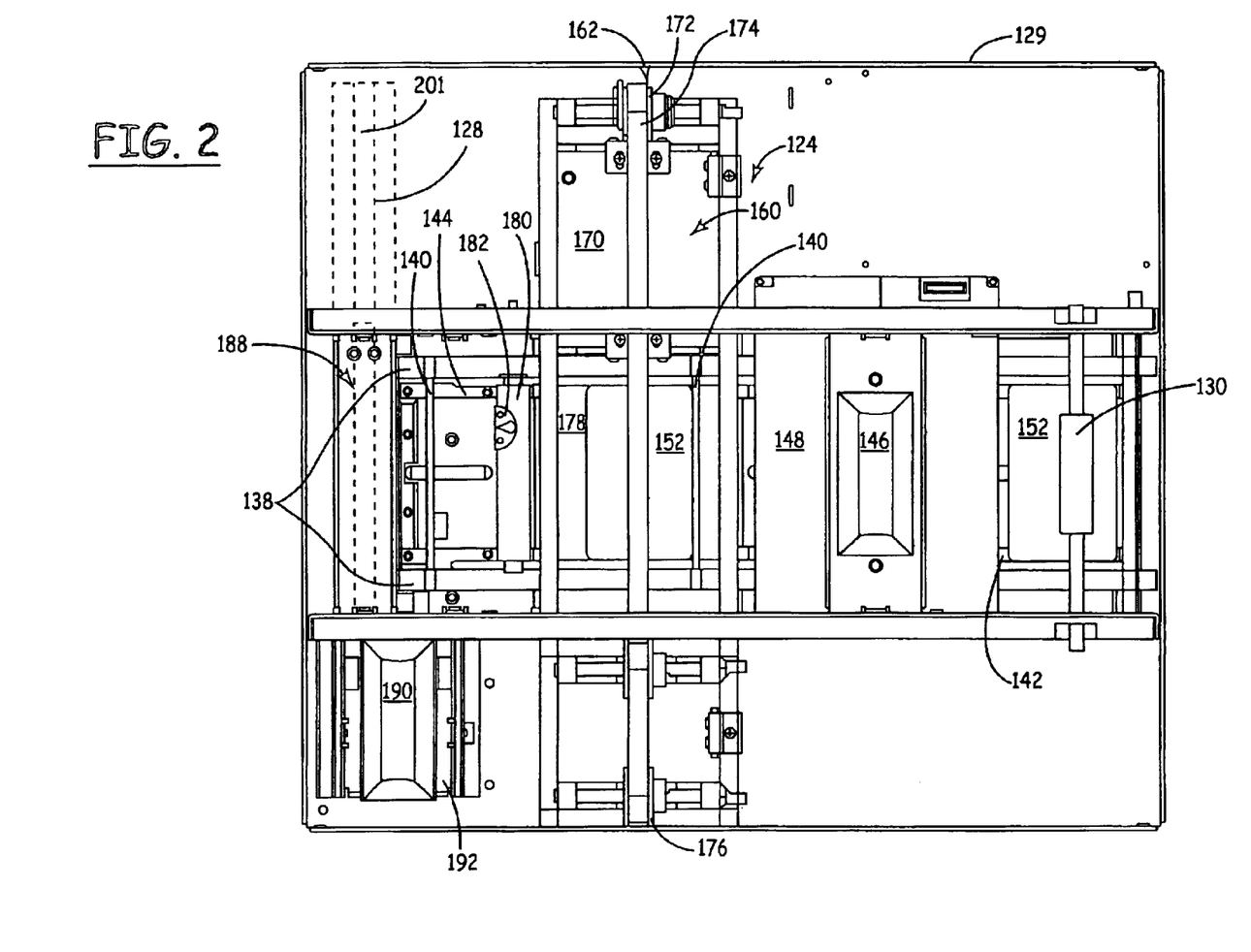
FIG. 2 is a top plan view of the printer according to a preferred embodiment of the present invention.

Referring to FIGS. 1 and 2, the card printing system 100 of the present invention generally comprises a printer subsystem 120 and a cartridge subsystem 121.

I. Printing System—Printer Subsystem

The printer subsystem 120 itself includes a number of mechanical components as well as an exposure system 122, a developing system 124, an optional card inverting system 126, and an optional magnetic encoding system 128 each of which is supported by appropriate framing or supports, and each of which is enclosed in an opaque, light-sealed housing 129. The mechanical components include a motor-driven card feed roller 130 and a card feed belt 132 that is held taught by a constant force slip clutch 134. The mechanical components further include a motor-driven card transfer pulley shaft 135 and a pair of card transfer belts 138 that are held taught by a card transfer pulley 136. The card transfer belts 138 are preferably joined together by virtue of a plurality of pusher bars 140 that smoothly move the card through the printer upon guide rails 142 and 144 (see FIG. 2).

Figure 3:
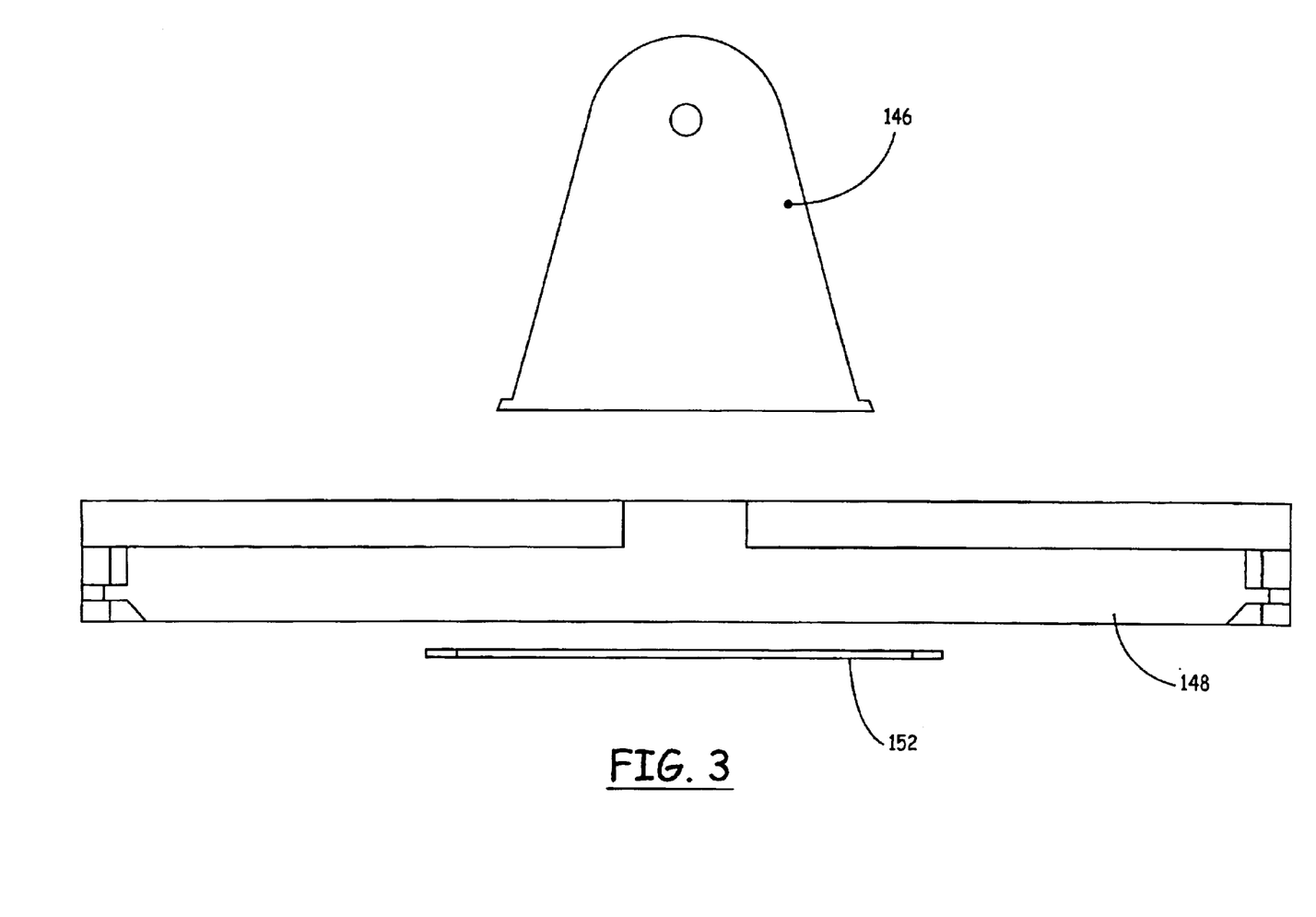
FIG. 3 is a cross-section view from the front of the printer of the light source, reflector and LCD display for exposing the card according to a preferred embodiment of the present invention.

The exposure system 122 generally includes a lamp and reflector assembly 146, a liquid crystal display (LCD) 148, and a card lift plate assembly 150, including lift plate 151. The card lift plate assembly 150 operates to lift a card 152 to a position in contact with the LCD 148, however, the card 152 does not move across, but is held stationary on, the surface of the LCD 148. The lamp and reflector assembly 146 generate a nearly columnar white light of a specific spectral temperature. The spectral temperature is preferably in the range of 6000° to 7000° Kelvin, and more preferably is approximately 6500° K. The white light then passes through the LCD 148 exposing the card 152, which incorporates photosensitive microcapsules to light of specific wavelengths to activate the microcapsules in a pattern according to the image display on the LCD 148. (The image is obtained from an external device that provides an image signal to the printer sub-assembly). See FIG. 3 for an enlarged view of the lamp and reflector assembly 146 and LCD 148. The specific wavelengths are those of light blue (400 to 500λ, typical peak 460λ) to activate yellow, green (450 to 600λ, typical peak 520λ) to activate magenta, and red (600 to 700λ, typical peak 660λ) to activate cyan. In the preferred embodiment, the LCD 148 is a SHARP™ LCD having item number LQ64D343. The lamp of the lamp and reflector assembly 146 is preferably a Perkin Elmer lamp having item number AD0601 while the reflector is a custom design of CyCard Technologies, Inc. It should be noted that the card 152 never moves across the surface of the LCD 148 when in contact with the LCD 148 thereby limiting the wear and impact damage to the LCD imaging device and increasing its lifetime of use. Prior art devices, such as thermal printhead ID card printers suffer such wear and impact damage. Further, thermal printers require multiple passes, which increases print time and reduces image quality due to the required registration of each individual pass to previous passes; registration requirements are a problem that is eliminated by the present invention.

Figures 4A, 5:
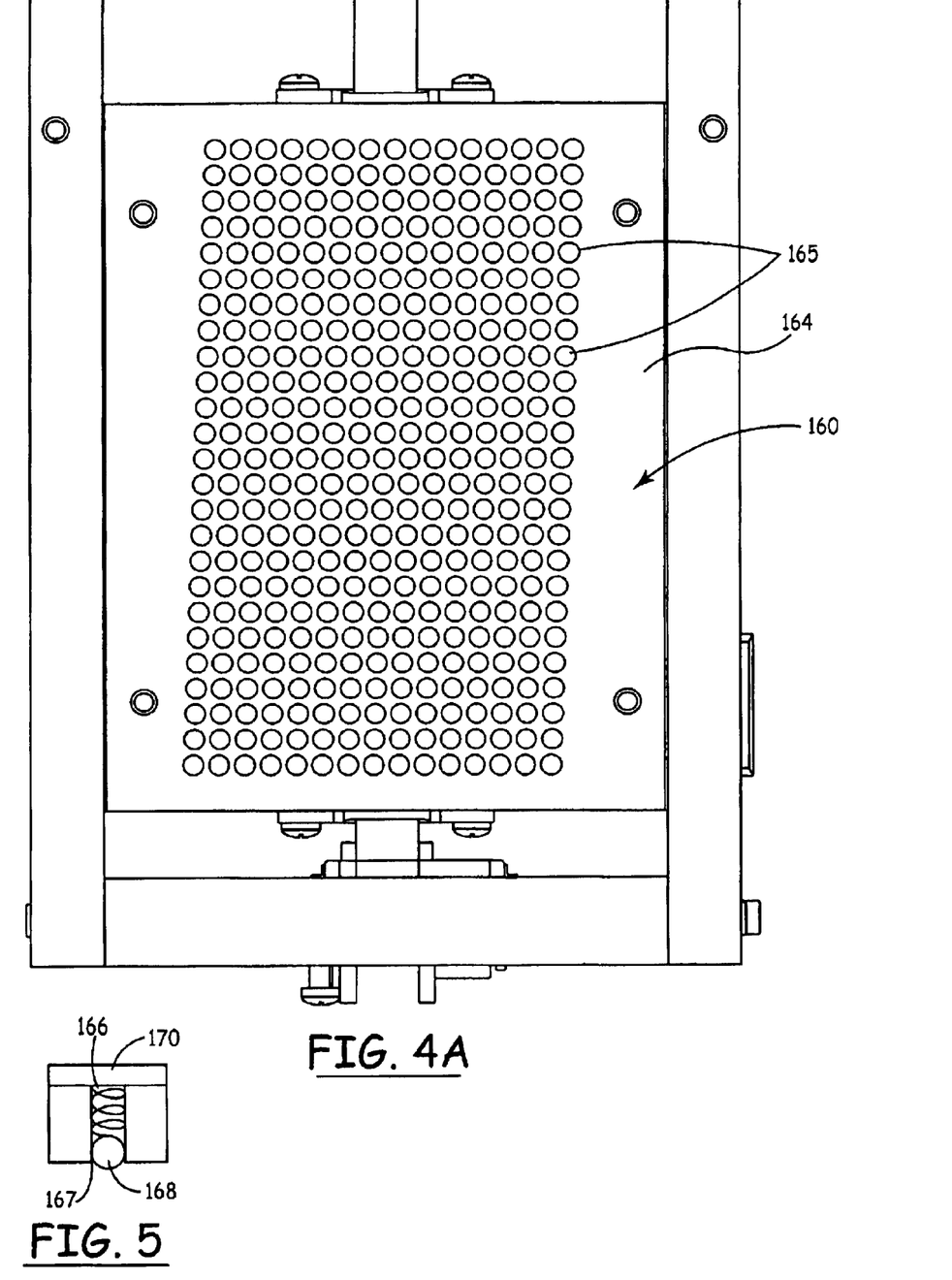
FIG. 4A is a bottom plan view of the array of spring-loaded developer balls used in the developing system of a preferred embodiment of the present invention.
FIG. 5 depicts the developer ball and spring configuration of the developer array.
Figure 6:
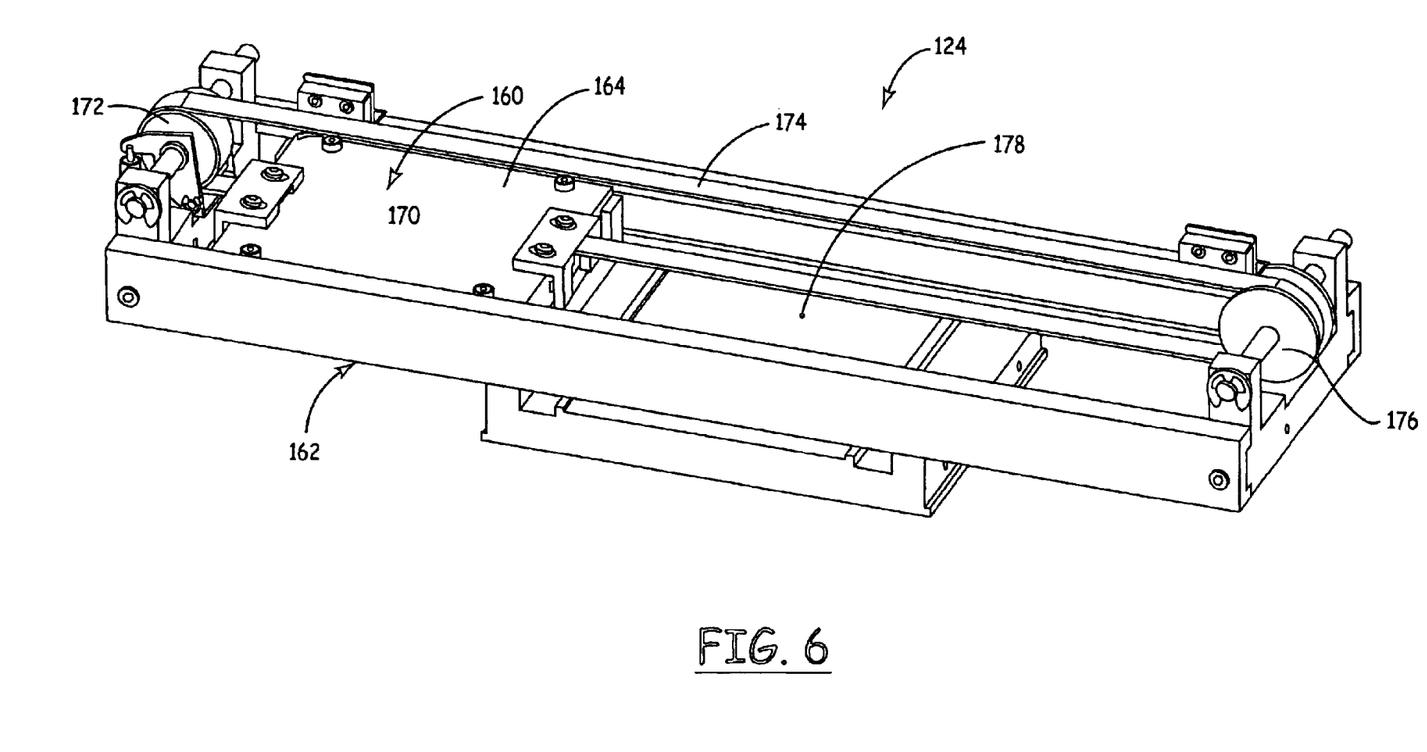
FIG. 6 is a perspective view of the developing system, including the developer array and the developer traversal system, of the preferred embodiment of the present invention.

The developing system 124, depicted generally in FIGS. 1 and 2, and more specifically in FIGS. 4A and 6, of the printer subsystem 120 generally includes the components of a developer array 160 and a developer traversal system 162. The developer array 160 includes a developer block 164 that incorporates a plurality of cylindrical holes 165 that are arranged in a series of staggered rows, see FIG. 4. Further comprising the developer array 160 are a plurality of springs 166, one per cylindrical hole 165, and plurality of developer balls 168, also one per cylindrical hole 165. Each spring 166 rests between a top plate 170 of the developer block 164 and a free floating developer ball 168, see FIG. 5 for an example configuration of one spring 166 and one developer ball 168 within a cylindrical hole 165. The exterior face 167 of each cylindrical hole 165 is each drilled to enable only a small portion, e.g., 0.0035", of each developer ball 168 to extend through the face 167. Note that the developer balls 168 in the developer array block 164 are preferably staggered and spaced in 15 rows of 25 developer balls that are preferably spaced 0.0059" apart along the path of travel so that the crush zone of each individual developer ball 168 overlaps the crush zone of each adjacent developer ball 168. It should be noted that by utilizing a scanning ball array/a set of pressure rollers, the image development time is significantly shortened from that of prior art printing systems. Specifically, the entire card 152 can be developed in one or two passes of the developer array 164 instead of requiring over 300 passes as an individual scanning ball of previous inventions required.

Figure 4B:
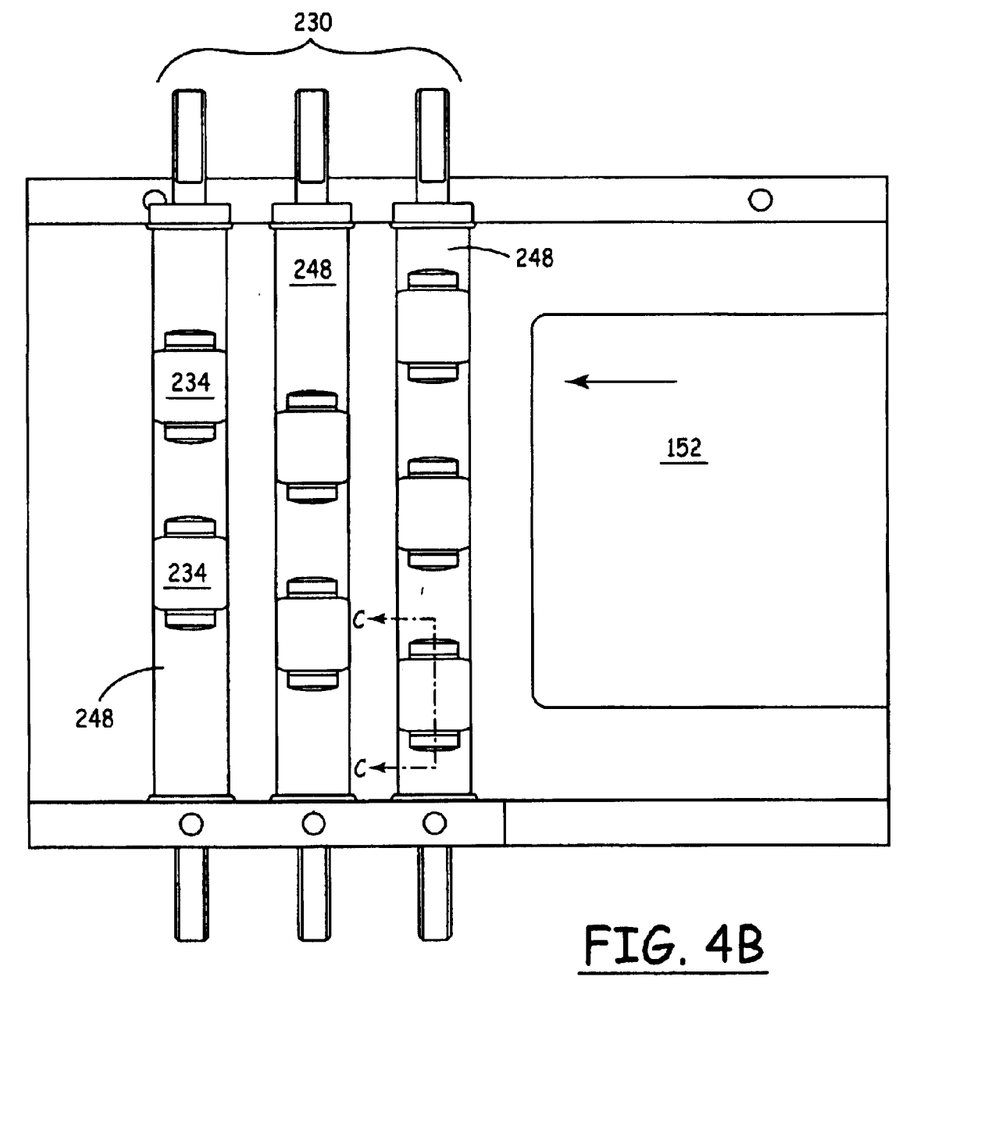
FIG. 4B is a top plan view of a seven-segment roller array used in the developing system of an alternative embodiment of the present invention.
Figure 4C:
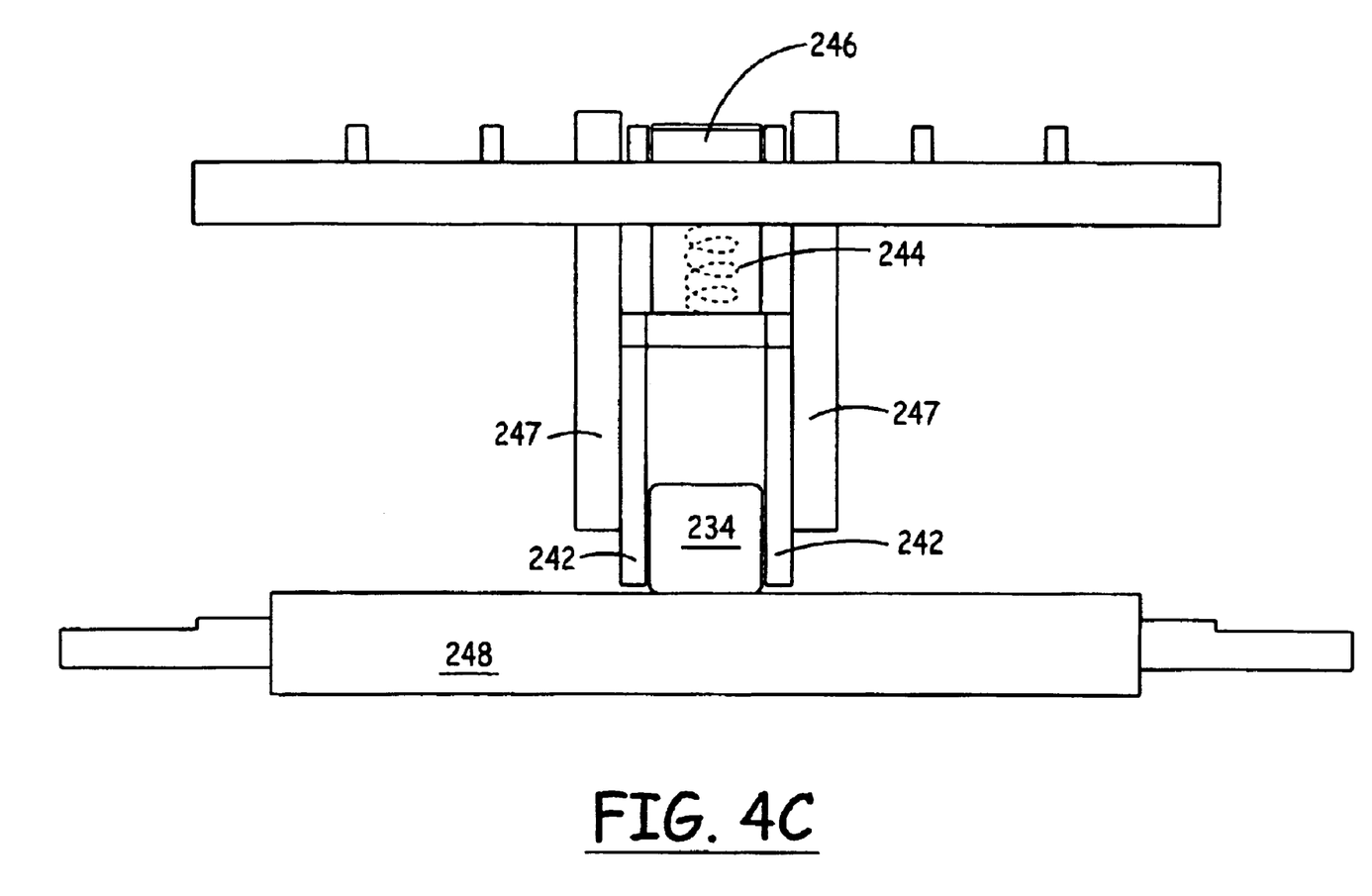
FIG. 4C is a front cross-sectional view of one of the roller segments of the seven-segment roller array of FIG. 4B.
Figure 4D:
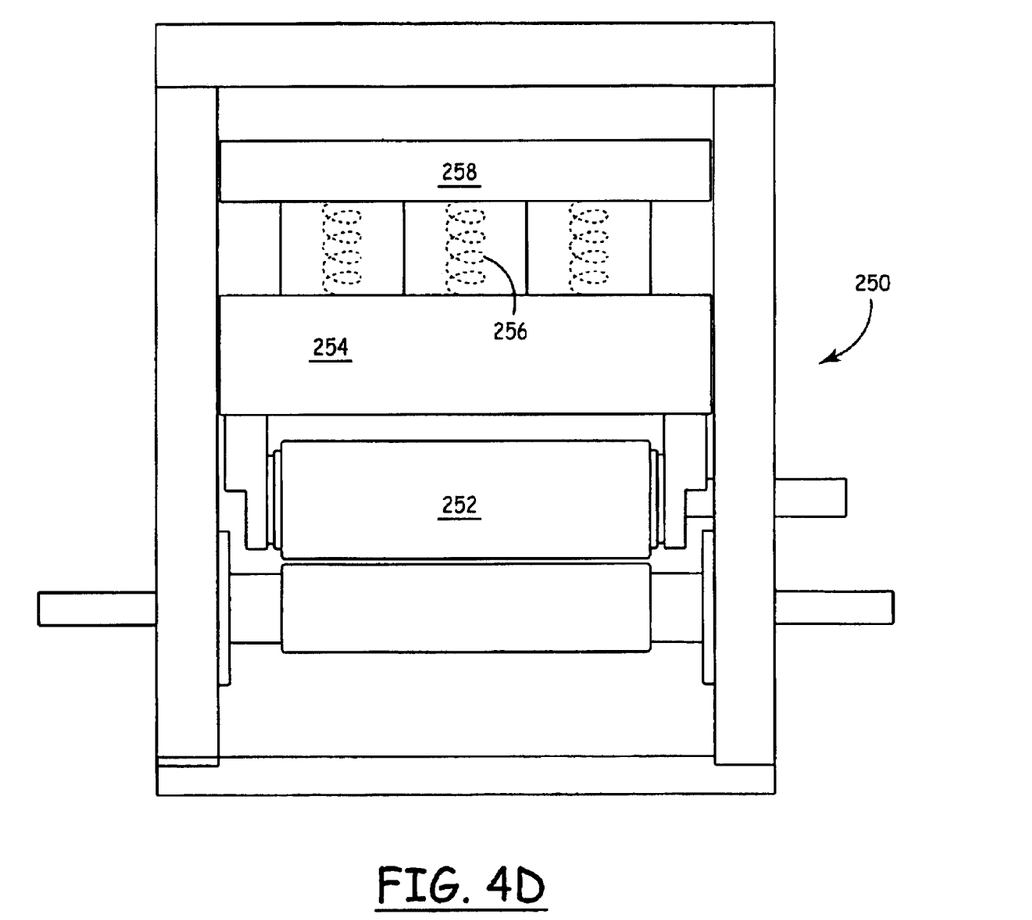
FIG. 4D is a front view of a single roller developer used in the developing system of an alternative embodiment of the present invention.

In an alternative embodiment of the developing system 124, the developer array 160 is replaced with a stationary fixture roller array 230, as depicted in FIGS. 4B and 4C, which also eliminates the need for developer traversal system 162. As shown, the roller array 230 comprises a plurality of roller segments 234 that are presented in a staggered pattern to ensure coverage of all areas of card 152. Specifically, this embodiment is provided with a staggered pattern of seven roller segments 234. The roller segments 234 are supported by side support plates 242, which enable springs 244 to be positioned above the roller segments 234. A top plate 246 is placed over the springs 244, and roller guides 247 are provided to each side of the roller segments 234. A platen 248 roller is provided, one per each row of roller segments 234, to support the card 152 against the pressure of the roller array 230. FIG. 4D presents still another alternative embodiment to that of developer array 160, a stationary, single roller developer 250. As shown, the single roller developer 250 provides a single pressure roller 252 positioned beneath a roller guide 254. A plurality of springs 256 are placed over roller guide 254 and are maintained in position by a top plate 258. A platen 260 is provided to support the card 152 against the pressure of the single pressure roller 252.

The developer traversal system 162 is best appreciated in FIG. 6 and, as shown, includes a motor-driven developer traversal pulley 172 and a developer traversal belt 174 that is held taught by developer traversal pulley 176. Each end of the developer traversal belt 174 is secured to a side of the top plate 170 enabling the developer traversal belt to scan the developer array 160 across an underlying card 152. A platen 178 is preferably provided to support the card 152 against the pressured applied by the developer array 160. In the preferred embodiment, a pressure of approximately 10,000 psi is provided at each developer ball 168 contact point. It should be noted that the pressure applied is dependent on the media used and should be selected appropriately. Any pressure suitable to the media may be utilized without departing from the spirit or scope of the invention.

The printer subsystem 120 further includes the mechanical components of a heated roller 180, which is provided to accelerate the development process upon the card 152 having been subjected to the developer array 160, and a platen roller 184 for encouraging contact of the card 152 with the heated roller 180. Note that in the preferred embodiment the heated roller 180 is heated to 70° C.±10° C., a thermocouple 182 is preferably provided to measure and regulate the temperature of the heated roller 180.

Following the heated roller 180, are the mechanical components of a finisher traversal system 188 that is positioned transverse to the direction of travel of the card transfer belts 138, a light and reflector assembly 190, and an output bin 192. The finisher traversal system 188 includes a motor-driven traversal pulley 194 and a traversal belt 196 that is held taught by a traversal pulley 198. The traversal belt 196 pushes the developed card from the card transfer belts 138 into the output bin 192. The light and reflector assembly 190 is positioned over the output bin 192 and operates to provide light to bleach the developed card and finish the development process. A second embodiment of the bleaching light preferably provides a WLED array positioned immediately after the heated roller 180. Optionally, the developed card may be provided to an output card hopper or into an optional encoding section.

Figure 7:
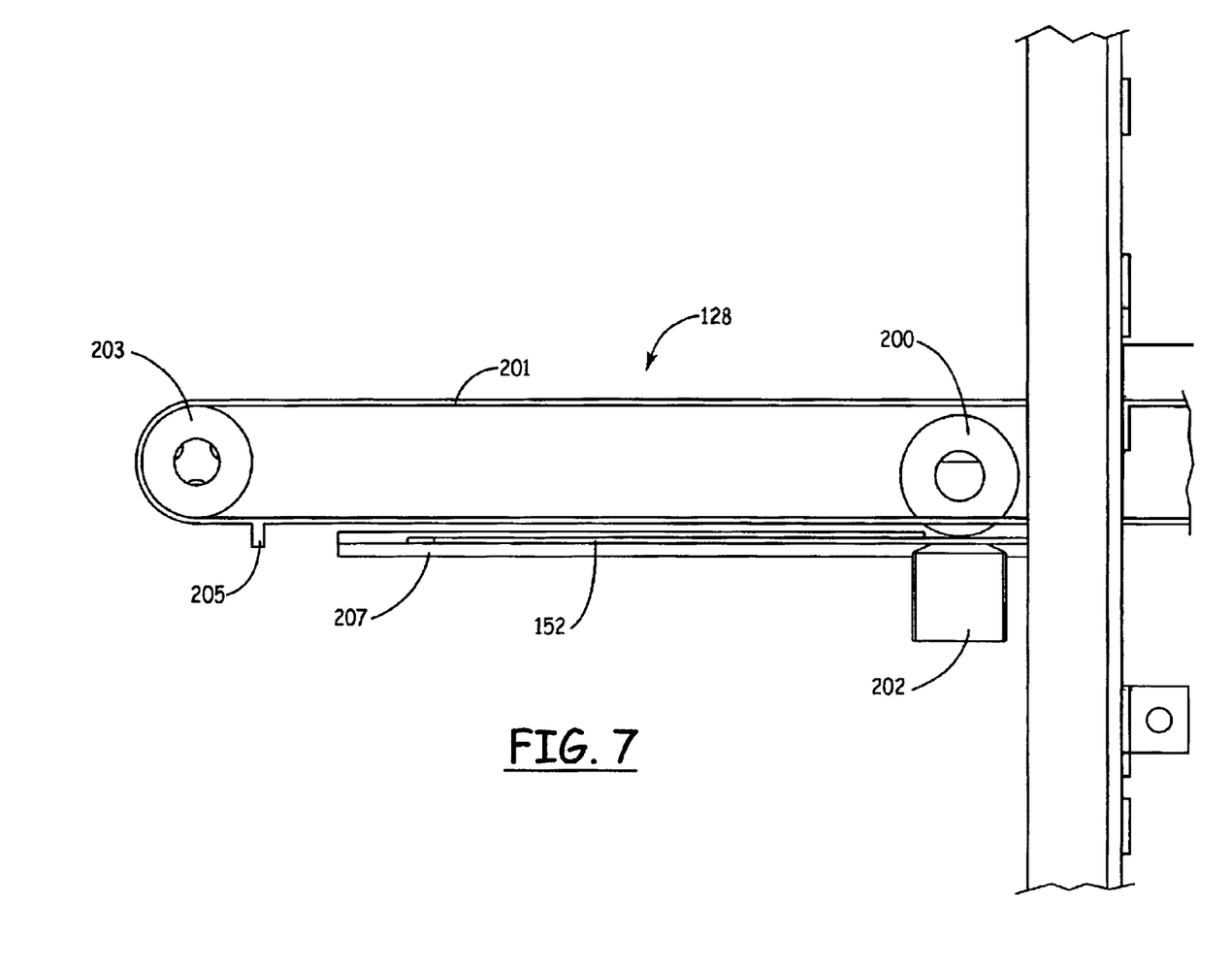
FIG. 7 is a side view of an optional magnetic encoding section of the present invention.

The optional encoding section preferably comprises the optional magnetic encoding system 128 as depicted in FIG. 7, its position within the printer sub-assembly is indicated by the dashed line within FIG. 2. The magnetic encoding system 128 includes a card feed roller 200 that is positioned over a magnetic printing head 202 that is used to encode magnetic data onto card 152. The magnetic encoding system 128 preferably utilizes a plurality of belt lugs 205 on a card transfer belt 201 (operable with pulley 203) in combination with guide rails 207 to move the card 152 to the magnetic head 202 and roller 200. Upon finishing magnetic printing, the card transfer belt 201 is preferably used to push the developed and magnetically printed card into the output bin 192 or an optional output card hopper.

The speed of the roller 200 is faster than that of the card transport belt 201 so that the card transport belt lug 203 can be used to bring the card 152 to the roller 200/magnetic head 202 combo, but will not interfere with the magnetic encoding process as the card 152 will pull away from the card transport belt lug 203 when under the control of the roller/magnetic head combo. When finished, the card transport belt 201 will reverse direction so that the card transport belt lug 203 can return the card 152 to the printer. The main benefit of this setup is that while encoding, the only roller having control over the card is the roller above the magnetic head, so there will be no jitter on the recording of the magnetic card caused by the card engaging or disengaging with another roller.

In the event that dual sided printing of the card 152 is desired, the optional card inverting system 126 of the printer subsystem 120 can be utilized. The card inverting system 126 incorporates the motor-driven card transfer shaft 135 and the pair of card transfer belts 138 that are held taught by a card transfer pulley 136. To utilize the card inverting system, the direction of rotation of the card transfer shaft 135 is reversed enabling a card 152 that has been imprinted on one side to traverse back to its starting point upon the card transfer belts 138. As the card transfer belts 138 carry the card 152 past its starting point, the card 152 is directed to a card flip plate 204, see FIG. 1. A pair of card flip lever arms 206 are preferably provided and raise upward to lift the card upward from the belts 138 so that the card 152 is presented at an angle to catch the lip 208 of the card flip plate 204. As the card 152 traverses across the lip 208 of the card flip plate 204, the card flip lever arms 206 are lowered so that upon the card 152 flipping over the card flip lever arms 206 are out of the way enabling the direction of rotation of the card transfer shaft 135 to reverse yet again and move the flipped card towards the developer array 160. It should be noted that the card inverting system needs no rotating axis about which to turn the card, rather the use of reverse direction and a card flip plate 204 provide the printer sub-assembly with a lower part count and a cheaper card flipping mechanism that also encourages time savings.

II. Printing System—Cartridge Subsystem

Figure 8:
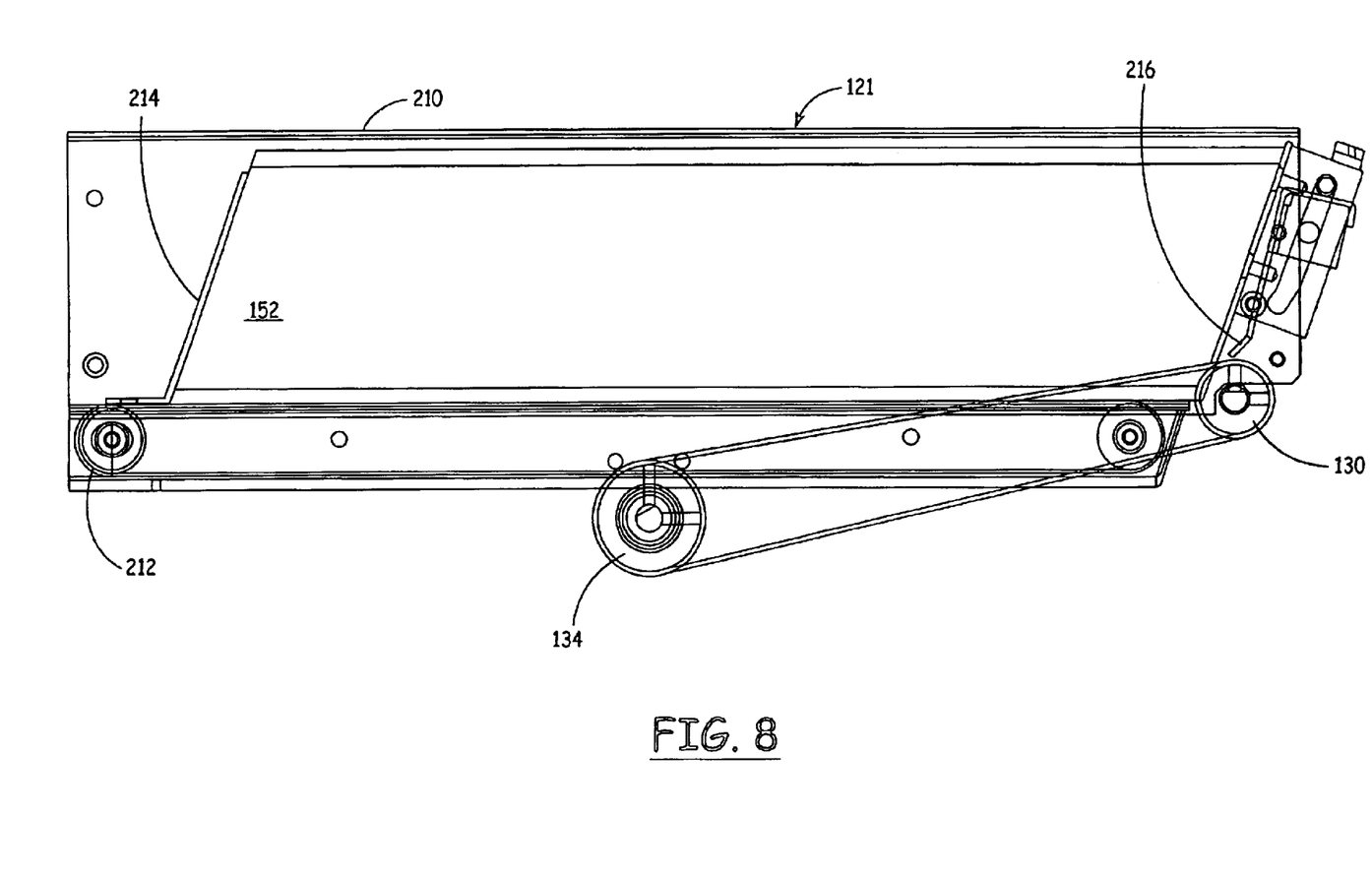
FIG. 8 is a side view of the card-containing cartridge with constant force slip clutch according to a preferred embodiment of the present invention.

The cartridge subsystem 121 is depicted in FIGS. 1 and 8. As shown, the cartridge subsystem 121 preferably includes an opaque, light-sealed housing 210 that is configured to hold a horizontal stack of cards 152, i.e., the cards 152 stand on their elongated edge and are stacked front to back against each other. Each of the cards 152 has been previously plied with photosensitive microcapsules. The card feed roller 130 from the printer subsystem 120 interfaces with the housing 210 and feeds the cards 152 one by one onto the card transfer belts 138 (see the angled presentation of the card 152 as it leaves the housing 210 enabling it to fall flat onto the card transfer belt 138 in FIG. 1). The card feed roller 130 is driven by a motor that is also connected to the constant force slip clutch 134 by a belt and pulley drive 132. The constant force slip clutch 134 is attached, via a shaft, to another pulley (not visible) that engages the belt and pulley drive 212 inside the cartridge to advance the card 152 with a card advancement guide 214. The card advancement guide 214 is preferably attached to the belt and pulley drive 212 to move the card stack forward to the card feed roller 130. A motion limiting device, such as a ratcheting mechanism attached to the card advancement guide 214, or a one-way pulley in the belt and pulley drive 212, is used to prevent the card advancement guide 214 from backing up and creating a loose stack of cards.

A spring loaded retractable door 216 is used to keep a light seal when the cartridge housing 210 is not interfaced to the printer subsystem 120. The door 216 is opened by a mechanical lever (not visible) that is activated by the motion of inserting the cartridge housing 210 into the printer subsystem. The door 216 automatically closes before the cartridge leaves the darkness of the printer by the retraction of the lever 218 and the spring force on the door 216.

Since the constant force slip clutch 134 is driven by the same motor that drives the card feed roller 130, it advances the card stack towards the roller 130 with the same force from the first to the last card in the stack as each individual card is fed into the printer subsystem 120. The ability to maintain a constant force addresses the problem of variable force that is found within vertical card stacks, i.e., the weight of the vertically stacked cards changes as the cards are fed into the printer resulting in variable force. Further, vertical stacks are limited in the amount of cards that they can hold due to scratching that can occur on the card surface of the first several cards of a full card stack as a result of the weight of the cards. Since the frictional force from sliding the horizontal stack is much less than the weight of a large vertical stack, the present invention can allow much larger input and output cartridges/hoppers. Horizontal feed also allows for a smaller case size when utilizing large input and output hoppers. In the preferred embodiment of the present invention, the input cartridge preferably provides a card stack of at least 100 cards and, more preferably, a 300 card horizontal stack, as well as a 100 card output bin or optional 300 card output hopper. Both the input cartridge and output hopper preferably run along the length of the printer subsystem 120, above and below it, respectively. These cartridges/hoppers result in a 3 inch increase in the height of the printer sub-assembly 120 as opposed to a vertical stack unit which would require an additional ten inches of height.

It should be noted that the cartridge sub-assembly 121 is designed to be freely exchanged for another cartridge of the same or different card type even with some of the cards remaining therein. The type of card contained within the cartridge is preferably specified by a device on the cartridge enabling printing to be carried out while the cartridge is freely exchanged.

The cartridge sub-assembly 121 may optionally be provided with a smart card having a memory chip wherein the smart card is removably attached to the cartridge and is used to provide potential color correction settings based upon the specific media in the cartridge and to provide a report of all events that occur while the cartridge is interfaced to the printer subassembly. In addition, the smart card may optionally be used to identify the card type in the cartridge, the supplier information, the number of cards in the cartridge, and to provide added security features.

III. Printing System—Operation

In operation, the card printing system is initiated by interfacing the cartridge subassembly assembly 121 to the printer sub-assembly 120. The cartridge subassembly 121 has been previously loaded with a horizontal stack of a plurality of cards 152 that have been plied with photosensitive microcapsules that encapsulate color developing material, with photo-curing material, and with an image receiving layer. The card feed roller 130 feeds the cards 152 one by one at an angle to the guide rails 142, 144 and card feed belt 138 whereby gravity draws the card 152 down.

Once upon the guide rails 142, 144, the card transfer belt 138 utilizes the pusher bars 140 to push the card 152 forward to a position atop card lift plate 150 wherein the card lift plate 150 raises the card 152 to contact the LCD 148 and wherein the LCD 148, upon being backlit by the light and reflector assembly 146, forms a latent image on the card 152. The card lift plate 150 then lowers and the card 152 is then pushed along the card guide rails 142, 144 to a position atop the platen 178 wherein the developer array 160, with its spring loaded developer balls 168, apply mechanical pressure to the card 152 to collapse those microcapsules that were not exposed to the light of specific wavelength and did not cure. In applying the mechanical pressure, the image is developed by reacting the color developing material in the collapsed microcapsules with the image receiving layer. Immediately after submission to the developer array 160, the card 152 is submitted to the heated roller 180 to accelerate the development of the image on the card 152.

After passing the heated roller 180, the card 152 is subject to the finisher traversal system 188 wherein the card 152 is pushed into an output bin 192 and subjected to a bleaching light from the light and reflector assembly 190. Alternatively, the card 152 may be pushed to an output hopper or may optionally be magnetically printed. In the instance of a desire for dual sided printing, the direction of the card transfer pulley shaft 135 may be reversed causing the card 152 to traverse back to its starting point where card flip lever arms 206 raise pushing the card 152 to contact the card flip plate 204 causing the card 152 to fall backwards onto the card transfer belt 138. The direction of the card transfer pulley shaft 135 is then once again reversed and the back side of the card 152 is presented for printing in the manner that the front side was printed.

The timing and sequence of operations of the printer sub-assembly 120 are preferably controlled by a pre-programmed firmware that is attached to or built into the printer sub-assembly 120.

The present invention may be embodied in other specific forms without departing from the spirit of the essential attributes thereof; therefore, the illustrated embodiment should be considered in all respects as illustrative and not restrictive, reference being made to the appended claims rather than to the foregoing description to indicate the scope of the invention.

What is claimed:

1. A card printing system, comprising:
   a cartridge sub-assembly, wherein said cartridge sub-assembly encloses a plurality of cards, wherein said plurality of cards have been previously plied with a plurality of photosensitive microcapsules; and
   a printer sub-assembly, wherein said printer sub-assembly interfaces with said cartridge sub-assembly to obtain one of said plurality of cards, wherein said printer sub-assembly forms a latent image upon the photosensitive microcapsules of the obtained card, and wherein said printer sub-assembly develops said latent image by applying mechanical pressure to said photosensitive microcapsules with a developer array.

2. The card printing system of claim 1, wherein both said cartridge sub-assembly and said printer sub-assembly are substantially completely light-sealed, and wherein both said cartridge sub-assembly and said printer sub-assembly maintain said the light-seal upon interfacing.

3. The card printing system of claim 1, wherein said plurality of cards are presented in a horizontal stack.

4. The card printing system of claim 1, wherein said printer sub-assembly develops said latent image by applying mechanical pressure to said photosensitive microcapsules with a developer array in a single scan or a double scan of said developer array.

5. The card printing system of claim 1, wherein said developer array comprises a plurality of spring-loaded developer balls.

6. The card printing system of claim 5, wherein each of said plurality of spring-loaded developer balls applies a pressure at a contact point of each of said plurality of spring-loaded developer balls that is appropriate to a media of the card.

7. The card printing of claim 1, wherein said printer sub-assembly further comprises a heated roller.

8. The card printing system of claim 1, wherein said printer sub-assembly forms said latent image by backlighting an LCD panel containing an image.

9. A card printing system, comprising:
supply means for supplying a plurality of media cards, wherein each of said plurality of media cards have been plied with a plurality of photosensitive microcapsules;
printing means for receiving one of said plurality of media cards, for forming a latent image upon the one card, and for applying an array of pressure points to said latent image for developing said latent image.

10. The card printing system of claim 9, wherein both said supply means and said printing means are light-sealed, and wherein both said supply means and said printing means maintain the light-seal upon said printing means receiving one of said plurality of media cards from said supply means.

11. The card printing system of claim 9, wherein said plurality of media cards are in the configuration of a horizontal stack.

12. The card printing system of claim 9, wherein said printing means develops said latent image in a single or a double application of said array of pressure points.

13. The card printing system of claim 9, wherein said array of pressure points is provided by a plurality of spring-loaded developer balls.

14. The card printing system of claim 13, wherein the pressure applied is selected appropriate to the media of the media card.

15. The card printing system of claim 9, wherein said printing means further includes a testing men for speeding development of said latent image.

16. The card printing system of claim 9, wherein said printing means further includes a light means for forming said latent image by backlighting an LCD panel containing an image.

17. A method of printing an identification card, the method comprising the steps of:
supplying an identification card that has been previously plied with a plurality of photosensitive microcapsules;
forming a latent image upon said identification card;
developing said latent image by application of an array of pressure points to said latent image.

18. The method of claim 17, further comprising the step of maintaining a light-seal about said identification card during said steps of supplying, forming, and developing.

19. The method of claim 17, wherein said step of supplying an identification card comprises supplying a plurality of identification cards in a horizontal stack.

20. The method of claim 17, wherein said latent image is developed in one or two applications of said array of pressure points to said latent image.

21. The method of claim 17, wherein said array of pressure points is provided by a plurality of spring-loaded developer balls.

22. The method of claim 21, wherein the pressure applied is selected appropriate to the media of said identification card.

23. The method of claim 17, further comprising the step of heating said for speeding development.

24. The method of claim 17, the step of forming a latent image upon said identification card is achieved by backlighting an LCD panel containing an image.

25. A card printing system, comprising:
a cartridge sub-assembly, wherein said cartridge sub-assembly encloses a plurality of cards, wherein said plurality of cards have been previously plied with a plurality of photosensitive microcapsules; and
a printer sub-assembly, wherein said printer sub-assembly interfaces with said cartridge sub-assembly to obtain one of said plurality of cards, wherein said printer sub-assembly forms a latent image upon the photosensitive microcapsules of the obtained card, and wherein said printer sub-assembly develops said latent image by applying mechanical pressure to said photosensitive microcapsules with a roller array.

26. The card printing system of claim 25, wherein said roller array comprises a plurality of roller segments.

27. A card printing system, comprising:
a cartridge sub-assembly, wherein said cartridge sub-assembly encloses a plurality of cards, wherein said plurality of cards have been previously plied with a plurality of photosensitive microcapsules; and
a printer sub-assembly, wherein said printer sub-assembly interfaces with said cartridge sub-assembly to obtain one of said plurality of cards, wherein said printer sub-assembly forms a latent image upon the photosensitive microcapsules of the obtained card, and wherein said printer sub-assembly develops said latent image by applying mechanical pressure to said photosensitive microcapsules with a single developer roll, wherein said single developer roll is positioned beneath a roller guide, and wherein an array of springs positioned over said roller guide apply said mechanical pressure through said roller guide to said single developer roll.

* * * * *